(12) United States Patent
Ikemoto et al.

(10) Patent No.: US 7,541,322 B2
(45) Date of Patent: Jun. 2, 2009

(54) CLEANING SOLUTION FOR SUBSTRATE FOR SEMICONDUCTOR DEVICE AND CLEANING METHOD

(75) Inventors: Makoto Ikemoto, Kitakyushu (JP); Hitoshi Morinaga, Kitakyushu (JP)

(73) Assignee: Mitsubishi Chemical Corporation, Tokyo (JP)

( * ) Notice: Subject to any disclaimer, the term of this patent is extended or adjusted under 35 U.S.C. 154(b) by 139 days.

(21) Appl. No.: 11/500,356

(22) Filed: Aug. 8, 2006

(65) Prior Publication Data

US 2006/0270573 A1 Nov. 30, 2006

Related U.S. Application Data

(63) Continuation of application No. PCT/JP2005/001521, filed on Feb. 2, 2005.

(30) Foreign Application Priority Data

Feb. 9, 2004 (JP) ............................ 2004-032222

(51) Int. Cl.
*C11D 7/32* (2006.01)
(52) U.S. Cl. ...................................... 510/175; 134/1.3
(58) Field of Classification Search ................. 510/175; 134/1.3
See application file for complete search history.

(56) References Cited

U.S. PATENT DOCUMENTS

| 6,143,705 A | 11/2000 | Kakizawa et al. |
| 6,436,302 B1 | 8/2002 | Li et al. |
| 6,730,644 B1 | 5/2004 | Ishikawa et al. |
| 6,740,629 B2 * | 5/2004 | Ando et al. ................. 510/245 |
| 2003/0171233 A1 | 9/2003 | Abe et al. |
| 2004/0137736 A1 * | 7/2004 | Daviot et al. ................ 438/690 |
| 2005/0020463 A1 * | 1/2005 | Ikemoto et al. ............ 510/175 |
| 2006/0040838 A1 * | 2/2006 | Shimada et al. ............ 510/175 |

FOREIGN PATENT DOCUMENTS

| JP | 2001-7071 | 1/2001 |
| JP | 2001-156029 | 6/2001 |
| JP | 3219020 | 8/2001 |
| JP | 2001-284308 | 10/2001 |
| JP | 2002-289569 | 10/2002 |
| JP | 2003-289060 | 10/2003 |
| JP | 2003-318150 | 11/2003 |
| WO | WO 01/30958 | 5/2001 |
| WO | WO 02/13242 | 2/2002 |
| WO | WO 02/086045 | 10/2002 |
| WO | WO 03/065433 A1 | 8/2003 |
| WO | WO 03/091376 | 11/2003 |

* cited by examiner

*Primary Examiner*—Gregory E Webb
(74) *Attorney, Agent, or Firm*—Oblon, Spivak, McClelland, Maier & Neustadt, P.C.

(57) ABSTRACT

To provide a cleaning solution for a substrate for a semiconductor device capable of removing particle contamination, organic contamination and metal contamination at the same time without corroding the substrate surface, and further having good water rinsability and capable of making the substrate surface highly clean in a short time, and a cleaning method.

13 Claims, No Drawings

CLEANING SOLUTION FOR SUBSTRATE FOR SEMICONDUCTOR DEVICE AND CLEANING METHOD

TECHNICAL FIELD

The present invention relates to a cleaning solution and a cleaning method for a substrate for a semiconductor device. Particularly, it relates to a cleaning solution which removes fine particles (particles), organic contamination and metal contamination on a substrate for a semiconductor device having a metal wiring, a low dielectric constant (Low-k) insulating film, etc. on a part of or the entire surface, in a short time without corroding the metal wiring, and a cleaning method by means of the cleaning solution.

BACKGROUND ART

In production of semiconductor devices such as microprocessors, memories and CCD and flat panel display devices such as TFT liquid crystal, pattern formation and thin film formation are carried out at a level of from submicron to sub-0.1 μm on the surface of a substrate of e.g. silicon, silicon oxide ($SiO_2$) or glass, and it has been an extremely important issue to reduce a very small amount of contamination on the substrate surface in each step in production. Among contaminations of the substrate surface, particularly particle contamination, organic contamination and metal contamination decrease electric characteristics and yield of devices, whereby they have to be reduced as far as possible before the next step is carried out. For removal of the contamination, cleaning of the substrate surface by means of a cleaning solution is commonly carried out. For the cleaning, it is required to highly clean the surface without any adverse effect in a short time with high reproducibility at a low cost. The level of these requirements is increasingly strict along with high integration and price-reduction of devices in recent years.

In production of semiconductor devices in recent years, a new metal material (such as Cu) having a low resistance as a wiring and a low dielectric constant (Low-k) material as an interlayer dielectric film are becoming introduced to achieve an increase in the speed and high integration of devices. Further, for formation of a wiring, application of CMP (chemical mechanical polishing) technique is in progress. For cleaning between steps, conventional RCA clean employing a mixture of an acidic or alkaline solution with hydrogen peroxide can not be employed since a wiring material will be corroded. Further, many of low dielectric constant insulating films have a hydrophobic surface, repel the cleaning solution and are thereby hardly cleaned. Further, cleaning after the CMP step is problematic in that a slurry (abrasive grains) to be used for CPM will contaminate the wiring or the low dielectric constant insulating film surface. To dissolve these problems, application of various cleaning technique has been attempted.

For example, a cleaning solution containing a surfactant having a specific structure, capable of removing particle contamination and metal contamination without corroding a transition metal on the surface, has been proposed (JP-A-2001-284308).

Further, a cleaning solution having an organic acid compound added to a dispersant and/or a surfactant for removal of metal impurities and particles adsorbed on a substrate having a metal wiring, has been proposed (JP-A-2001-007071).

Further, a cleaning solution containing an aliphatic polycarboxylic acid and a surfactant, with which the contact angle of a substrate having a surface contact angle of at least 70° when water is dropped thereon, is brought to be at most 50°, has also been proposed (JP-A-2003-318150).

Further, a cleaning solution containing an organic acid and a complexing agent, capable of removing particles and metal contamination without corroding a metal wiring, has been proposed (Japanese Patent No. 3219020).

Further, an effective method of planarizing Cu and a Cu alloy to significantly reduce surface defects, has been proposed (JP-A-2001-156029).

Further, a cleaning solution having an alkali or an organic acid added to a specific surfactant and water, to remove fine particles and organic contamination attached to a substrate without corroding the substrate surface, has also been proposed (JP-A-2003-289060).

DISCLOSURE OF THE INVENTION

Problem that the Invention is to Solve

Introduction of new materials such as a low resistance metal wiring material such as Cu and a low dielectric constant material has been increasingly in progress in recent years for further increase in the speed and higher integration of semiconductor devices. In order to solve various problems in cleaning of a substrate in production of a semiconductor device employing these materials, the above-described cleaning methods have been proposed, but no technique which can completely remove various contaminations on the surface of a hydrophobic low dielectric constant insulating film and a Cu film which is likely to be corroded in a short time, has been proposed, and its establishment has been desired.

To effectively clean off the contamination on the surface of a hydrophobic low dielectric constant insulating film, it is important to improve wettability on the hydrophobic surface employing a surfactant. However, by conventional technique, the surfactant is hardly removed (particularly on the Cu surface) in a rinsing step employing ultrapure water, whereby rinsing for a long period will be required, and shortening of cleaning time has been inhibited.

The present invention has been made to solve the above problem, and it is an object of the present invention to provide a cleaning solution for a substrate for a semiconductor device, capable of removing particle contamination, organic contamination and metal contamination at the same time without corroding the substrate surface, having good water rinsability and capable of making the substrate surface highly clean in a short time, and a cleaning method.

Means of Solving the Problem

The present inventors have conducted extensive studies to solve the above problem and as a result, found that a cleaning solution comprising an organic acid, an organic alkaline component and a surfactant and having a specific pH, is capable of removing particle contamination, organic contamination and metal contamination at the same time without corroding the substrate surface, and further has improved water rinsability and is capable of making the substrate surface highly clean in a short time. The present invention has been accomplished on the basis of this discovery.

Namely, the present invention provides the following.

1. A cleaning solution for a substrate for a semiconductor device, which comprises the following components (a), (b), (c) and (d) and which has a pH of at least 1.5 and less than 6.5:

component (a): an organic acid
component (b): an organic alkaline component
component (c): a surfactant
component (d): water 2. The cleaning solution for a substrate for a semiconductor device according to the above 1, wherein the substrate for a semiconductor device has a metal wiring on its surface.
3. The cleaning solution for a substrate for a semiconductor device according to the above 1 or 2, wherein the substrate for a semiconductor device has a low dielectric constant insulating film on its surface.
4. The cleaning solution for a substrate for a semiconductor device according to any one of the above 1 to 3, wherein the component (a) is a $C_{1-10}$ organic compound having at least one carboxyl group.
5. The cleaning solution for a substrate for a semiconductor device according to the above 4, wherein the component (a) is at least one organic acid selected from the group consisting of acetic acid, propionic acid, oxalic acid, succinic acid, malonic acid, citric acid, tartaric acid and malic acid.
6. The cleaning solution for a substrate for a semiconductor device according to any one of the above 1 to 5, wherein the component (b) is represented by the following formula (I):

  (I)

wherein $R^1$ is a hydrogen atom or an alkyl group which may be substituted by a hydroxyl group, an alkoxy group or halogen, and four $R^1$ may all be the same or different from one another, provided that a case where all are simultaneously hydrogen atoms, is excluded.
7. The cleaning solution for a substrate for a semiconductor device according to the above 6, wherein the component (b) is a quaternary ammonium hydroxide having a $C_{1-4}$ alkyl group and/or a $C_{1-4}$ hydroxyalkyl group.
8. The cleaning solution for a substrate for a semiconductor device according to any one of the above 1 to 7, wherein the component (c) is an anionic surfactant.
9. The cleaning solution for a substrate for a semiconductor device according to the above 8, wherein the anionic surfactant is at least one anionic surfactant selected from the group consisting of an alkylsulfonic acid or its salt, an alkylbenzenesulfonic acid or its salt, an alkyldiphenyl ether disulfonic acid or its salt, an alkylmethyltaurate or its salt, an alkyl sulfate or its salt, an alkyl ether sulfate or its salt and a sulfosuccinic acid diester or its salt.
10. The cleaning solution for a substrate for a semiconductor device according to any one of the above 1 to 9, wherein the content of the component (a) is from 0.05 to 10 wt %.
11. The cleaning solution for a substrate for a semiconductor device according to any one of the above 1 to 10, wherein the content of the component (b) is from 0.01 to 10 wt %.
12. The cleaning solution for a substrate for a semiconductor device according to any one of the above 1 to 11, wherein the content of the component (c) is from 0.0003 to 0.1 wt %.
13. The cleaning solution for a substrate for a semiconductor device according to any one of the above 1 to 12, wherein the weight ratio of the component (a) to (b) (i.e. component (a)/component (b)) is at least 0.8 and at most 5.
14. The cleaning solution for a substrate for a semiconductor device according to any one of the above 1 to 13, wherein the weight ratio of the component (c) to (b) (i.e. component (c)/component (b)) is at least 0.01 and at most 0.2.
15. A method for cleaning a substrate for a semiconductor device, which comprises cleaning a substrate for a semiconductor device by means of a solution which comprises the following components (a), (b), (c) and (d) and which has a pH of at least 1.5 and less than 6.5:
component (a): an organic acid
component (b): an organic alkaline component
component (c): a surfactant
component (d): water
16. The method for cleaning a substrate for a semiconductor device according to the above 15, wherein the substrate for a semiconductor device has a Cu film and a low dielectric constant insulating film on the substrate surface, and the substrate is cleaned after CMP treatment.
17. The method for cleaning a substrate for a semiconductor device according to the above 16, wherein the CMP treatment is carried out by an abrasive containing an azole type anticorrosive.
18. The method for cleaning a substrate for a semiconductor device according to any one of the above 15 to 17, wherein the component (a) is a $C_{1-10}$ organic compound having at least one carboxyl group.
19. The method for cleaning a substrate for a semiconductor device according to the above 18, wherein the component (a) is at least one organic acid selected from the group consisting of acetic acid, propionic acid, oxalic acid, succinic acid, malonic acid, citric acid, tartaric acid and malic acid.
20. The method for cleaning a substrate for a semiconductor device according to any of the above 15 to 19, wherein the component (b) is represented by the following formula (I):

  (I)

wherein $R^1$ is a hydrogen atom or an alkyl group which may be substituted by a hydroxyl group, an alkoxy group or halogen, and four $R^1$ may all be the same or different from one another, provided that a case where all are simultaneously hydrogen atoms, is excluded.
21. The method for cleaning a substrate for a semiconductor device according to the above 20, wherein the component (b) is a quaternary ammonium hydroxide having a $C_{1-4}$ alkyl group and/or a $C_{1-4}$ hydroxyalkyl group.
22. The method for cleaning a substrate for a semiconductor device according to any one of the above 15 to 21, wherein the component (c) is an anionic surfactant.
23. The method for cleaning a substrate for a semiconductor device according to the above 22, wherein the anionic surfactant is at least one anionic surfactant selected from the group consisting of an alkylsulfonic acid or its salt, an alkylbenzenesulfonic acid or its salt, an alkyldiphenyl ether disulfonic acid or its salt, an alkylmethyltaurate or its salt, an alkyl sulfate or its salt, an alkyl ether sulfate or its salt and a sulfosuccinic acid diester or its salt.
24. The method for cleaning a substrate for a semiconductor device according to any one of the above 15 to 23, wherein the content of the component (a) is from 0.05 to 10 wt %.
25. The method for cleaning a substrate for a semiconductor device according to any one of the above 15 to 24, wherein the content of the component (b) is from 0.01 to 10 wt %.
26. The method for cleaning a substrate for a semiconductor device according to any one of the above 15 to 25, wherein the content of the component (c) is from 0.0003 to 0.1 wt %.
27. The method for cleaning a substrate for a semiconductor device according to any one of the above 15 to 26, wherein the weight ratio of the component (a) to (b) (i.e. component (a)/component (b)) is at least 0.8 and at most 5.
28. The method for cleaning a substrate for a semiconductor device according to any one of the above 15 to 27, wherein the weight ratio of the component (c) to (b) (i.e. component (c)/component (b)) is at least 0.01 and at most 0.2.

Effects of the Invention

According to the present invention, it is possible to remove fine particles (particles), organic contamination and metal contamination on a substrate for a semiconductor device having e.g. a semiconductor material such as silicon, an insulating material such as silicon nitride, silicon oxide, glass or a low dielectric constant material, or a transition metal or a transition metal compound, on a part of or the entire surface, at the same time without corroding the substrate surface. Further, since the cleaning solution has good water rinsability, the substrate surface can be highly cleaned in a short time. Therefore, the present invention is industrially very useful as a technique for cleaning a contaminated substrate for a semiconductor device in production of a semiconductor device or a display device. Here, "having good water rinsability" means that when a substrate after cleaning is rinsed with water, the cleaning solution, and fine particles, organic contamination and metal contamination are easily removed from the substrate surface.

Best Mode for Carrying out the Invention

Now, the embodiment of the present invention will be described in detail below.

The cleaning solution of the present invention comprises an organic acid as component (a), an organic alkaline component as component (b), a surfactant as component (c) and water as component (d), and has a pH of at least 1.5 and less than 6.5.

In the present invention, the organic acid as component (a) generically represents an organic compound having acidity (pH<7) in water, and means one having an acidic functional group such as a carboxyl group (—COOH), a sulfo group (—SO$_3$H), a phenolic hydroxyl group (ArOH: Ar is an aryl group such as a phenyl group) or a mercapto group (—SH). The organic acid to be used is not particularly limited, but preferred is one having a carboxyl group as a functional group. More preferred is a C$_{1-10}$ organic compound having at least one carboxyl group. More preferred is one having 1 to 8 carbon atoms, and especially preferred is one having from 1 to 6 carbon atoms. The carboxylic acid is any one having at least one carboxyl group, and a monocarboxylic acid, a dicarboxylic acid, a tricarboxylic acid or the like may suitable be used. However, usually the number of carboxyl groups is at most 5. Specifically, formic acid, acetic acid, propionic acid, butyric acid, isobutyric acid, valeric acid, ethylmethyl acetic acid, trimethyl acetic acid, oxalic acid, succinic acid, malonic acid, citric acid, tartaric acid or malic acid may, for example, be mentioned. Preferred is acetic acid, propionic acid, oxalic acid, succinic acid, malonic acid, citric acid, tartaric acid or malic acid, and more preferred is acetic acid, oxalic acid or citric acid. These organic acid components may be used alone or in combination of two or more of them in an optional proportion.

The content of the component (a) in the cleaning solution of the present invention is usually at least 0.01 wt % to the cleaning solution, preferably at least 0.05 wt %, more preferably at least 0.1 wt %, for sufficient removal of contamination. However, the content of the component (a) is usually at most 30 wt %, preferably at most 10 wt %, more preferably at most 2 wt %, when emphasis is put on the substrate surface not being corroded and on economical efficiency. No higher effect will be obtained even if the concentration is too high.

In the present invention, the organic alkaline component as component (b) generically represents an organic compound having alkalinity (pH>7) in water. The organic alkaline component to be used is not particularly limited, and it may, for example, be a quaternary ammonium hydroxide, an amine or an aminoalcohol represented by the following formula (I):

(R$^1$)$_4$N$^+$OH$^-$     (I)

wherein R$^1$ is a hydrogen atom or an alkyl group which may be substituted by a hydroxyl group, an alkoxy group or halogen, and four R$^1$ may all be the same or different from one another, provided that a case where all are simultaneously hydrogen atoms, is excluded.

The quaternary ammonium hydroxide is preferably a compound of the above formula (I) wherein R$^1$ is preferably a C$_{1-4}$ alkyl group which may be substituted by a hydroxyl group, an alkoxy group or halogen, particularly a C$_{1-4}$ alkyl group and/or a C$_{1-4}$ hydroxyalkyl group. As R$^1$, the alkyl group may be a C$_{1-4}$ lower alkyl group such as a methyl group, an ethyl group, a propyl group or a butyl group, and the hydroxyalkyl group may be a C$_{1-4}$ lower hydroxyalkyl group such as a hydroxymethyl group, a hydroxyethyl group, a hydroxypropyl group or a hydroxybutyl group.

Further, the amine may, for example, be triethylamine or ethylenediamine, and the aminoalcohol may, for example, be monoethanolamine, diethanolamine or trimethanolamine.

Preferred as the component (b) is a quaternary ammonium hydroxide represented by the formula (I). Specifically, the quaternary ammonium hydroxide may, for example, be tetramethylammonium hydroxide (TMAH), tetraethylammonium hydroxide, trimethyl(hydroxyethyl)ammonium hydroxide (common name: choline) or triethyl(hydroxyethyl)ammonium hydroxide.

Among the above-described organic alkali components (b), particularly preferred as the organic alkaline component is tetramethylammonium hydroxide (TMAH), trimethyl(hydroxyethyl)ammonium hydroxide (common name: choline) or the like in view of the cleaning effect, small metal residues, economical efficiency, stability of the cleaning solution, etc. These organic alkaline components may be used alone or in combination of two or more of them in an optional proportion. Further, ammonia is unfavorable since it is likely to form a complex with copper used for the metal wiring, thus leading to corrosion.

The content of the component (b) in the cleaning solution of the present invention is usually at least 0.001 wt % to the cleaning solution, preferably at least 0.01 wt %, more preferably at least 0.05 wt %, to obtain sufficiently favorable water rinsability. However, the content of the component (b) is usually at most 30 wt %, preferably at most 10 wt %, more preferably at most 2 wt %, when emphasis is put on high contamination removal effect and economical efficiency. If the concentration is too high, the contamination removal effect may rather decrease in some cases.

In the present invention, the surfactant used as component (c) is not particularly limited, and it may be an anionic surfactant, a nonionic surfactant, a cationic surfactant or an amphoteric surfactant. The anionic surfactant may, for example, be an alkylsulfonic acid or its salt, an alkylbenzenesulfonic acid or its salt, an alkyldiphenyl ether disulfonic acid or its salt, an alkylmethyltaurate or its salt, an alkyl sulfate or its salt, an alkyl ether sulfate or its salt or a sulfosuccinic acid diester or its salt. The nonionic surfactant may, for example, be an alkylene oxide type surfactant such as a polyoxyethylene alkyl ether or a polyoxyethylene fatty acid ester. The cationic surfactant may be an amine salt type surfactant or a quaternary ammonium salt type surfactant. The amphoteric surfactant may, for example, be an amino acid type amphoteric surfactant or a betaine type amphoteric surfactant. Among them, preferred is use of an anionic surfactant. More preferred is a $C_{8-12}$ alkylbenzenesulfonic acid or its salt, a $C_{8-12}$ alkyldiphenyl ether disulfonic acid or its salt, a $C_{8-12}$ alkylmethyltaurate or its salt, a $C_{8-12}$ alkyl sulfate or its salt, a $C_{8-12}$ alkyl ether sulfate or its salt, or a $C_{8-12}$ sulfosuccinic acid diester or its salt. These surfactant components may be used alone or in combination of two or more of them in an optional proportion.

The content of the component (c) in the cleaning solution of the present invention is usually at least 0.0001 wt % to the cleaning solution, preferably at least 0.0003 wt %, more preferably at least 0.001 wt %, in order to obtain sufficient particle contamination removal performance. However, the content of the component (c) is usually at most 1 wt %, preferably at most 0.1 wt %, more preferably at most 0.05 wt %, when emphasis is put on suppression of excessive foaming and reduction of load in waste disposal. No higher effect will be obtained even when the concentration is too high.

The surfactant as component (c) may contain metal impurities such as Na, K or Fe at a level of from 1 to several thousand wtppm in the form of a commercial product in some cases, and in such a case, the component (c) is a metal contamination source. Accordingly, in a case where metal impurities are contained in the surfactant used as the component (c), it is preferred to purify the surfactant so that the contents of the respective metal impurities are usually at most 10 ppm, preferably at most 1 ppm, more preferably at most 0.3 ppm. The purification is preferably carried out, for example, by a method of dissolving the surfactant in water and applying the solution to an ion exchange resin so that the metal impurities are trapped in the resin. A cleaning solution having an extremely reduced metal impurity content can be obtained by using the component (c) thus purified.

In the present invention, water is used as component (d). As the water, usually deionized water, preferably ultrapure water is used, in a case where it is desired to obtain a highly cleaned substrate surface. Further, it is possible to use electrolytic ionized water obtained by electrolysis of water or hydrogen water having hydrogen gas dissolved in water.

The pH of the cleaning solution of the present invention is at least 1.5, preferably at least 2, more preferably at least 3, so as to suppress corrosion of the substrate surface. However, the pH is less than 6.5, preferably at most 6, more preferably at most 5, so as to sufficiently remove metal contamination.

In the cleaning solution of the present invention, the weight ratio of the organic acid as component (a) to the organic alkaline component as component (b) (i.e. component (a)/component (b)) is preferably at least 0.8, more preferably at least 1, so as to sufficiently obtain metal contamination removal effect. However, the weight ratio is preferably at most 5, more preferably at most 4, when emphasis is put on suppression of the corrosion of the substrate surface. No higher effect will be obtained even when the weight ratio is too high.

In the cleaning solution of the present invention, the organic alkali has an effect to accelerate leaving of the surfactant on the substrate surface, and it is thereby preferred that the cleaning solution contains the organic alkaline component in a large amount as compared with the surfactant, so as to obtain sufficient effect of improving water rinsability. Accordingly, the weight ratio of the surfactant as component (c) to the organic alkaline component as component (b) (i.e. component (c)/component (b)) is preferably at most 0.2, more preferably at most 0.15. However, no higher effect will be obtained even when the amount of the organic alkali is too large. Accordingly, the weight ratio is preferably at least 0.01, more preferably at least 0.05, when emphasis is put on economical efficiency.

In the cleaning solution of the present invention comprising these components (a) to (d), the contents of at least Na, Mg, Al, K, Ca, Fe, Cu, Pb and Zn among metal impurities in the cleaning solution, are preferably at most 20 ppb, more preferably at most 5 ppb, particularly preferably at most 0.1 ppb, with a view to preventing metal contamination of the substrate for a semiconductor device by cleaning. Particularly, the total content of these metal impurities is preferably at most 20 ppb, more preferably at most 5 ppb, particularly preferably at most 0.1 ppb.

In the cleaning solution of the present invention, a complexing agent may further be incorporated as the case requires, in addition to the components (a) to (d). The complexing agent has an effect of reducing metal contamination of the substrate surface. As the complexing agent, known one may optionally be used. The type of the complexing agent may be selected comprehensively considering the contamination level of the substrate surface, the type of the metal, the cleanness level required for the substrate surface, the cost of the complexing agent, chemical stability, etc. The following (1) to (4) may, for example, be mentioned.

(1) A compound having nitrogen as a donor atom and a carboxyl group and/or a phosphonic acid group: for example, an amino acid such as glycine; a nitrogen-containing carboxylic acid such as iminodiacetic acid, nitrilotriacetic acid, ethylenediaminetetraacetic acid (EDTA), trans-1,2-diaminocyclohexane tetraacetic acid (CyDTA), diethylenetriaminepentaacetic acid (DTPA) or triethylenetetraminehexaacetic acid (TTHA); or a nitrogen-containing phosphonic acid such as ethylenediaminetetrakis(methylenephosphonic acid) (EDTPO), nitrilotris (methylenephosphonic acid) (NTPO) or propylenediaminetetra(methylenephosphonic acid) (PDTMP) may be mentioned.

(2) A compound having an aromatic hydrocarbon ring and having at least two OH groups and/or O— groups directly bonded to a carbon atom constituting the aromatic hydrocarbon ring: for example, a phenol such as catechol, resorcinol or tiron, or a derivative thereof, may be mentioned.

(3) A compound having both the above structures (1) and (2): for example, the following (3-1) and (3-2) may be mentioned.

(3-1) Ethylenediamine di-o-hydroxyphenylacetic acid (ED-DHA) or its derivative: for example, an aromatic nitrogen-containing carboxylic acid such as ethylenediamine di-o-hydroxyphenylacetic acid (EDDHA), ethylenediamine-N,N'-bis[(2-hydroxy-5-methylphenyl)acetic acid (EDDHMA), ethylenediamine-N,N'-bis[(2-hydroxy-5-chlorophenyl)acetic acid) (EDDHCA) or ethylenediamine-N,N'-bis[(2-hydroxy-5-sulfophenyl)acetic acid] (EDDHSA); or an aromatic nitrogen-containing phosphonic acid such as ethylenediamine-N,N'-bis[(2-hydroxy-5-methylphenyl)phosphonic acid] or ethylenediamine-N,N'-bis[(2-hydroxy-5-phosphophenyl)phosphonic acid] may be mentioned.

(3-2) N,N'-bis(2-hydroxybenzyl)ethylenediamine-N,N'-diacetic acid (HBED) or its derivative: for example, N,N'-bis (2-hydroxybenzyl)ethylenediamine-N,N'-diacetic acid (HBED), N,N'-bis(2-hydroxy-5-methylbenzyl)ethylenediamine-N,N'-diacetic acid (HMBED) or N,N'-bis(2-hydroxy-5-chlorobenzyl)ethylenediamine-N, N'-diacetic acid may be mentioned.

(4) Others: for example, an amine such as ethylenediamine, 8-quinolinol or o-phenanthroline; a carboxylic acid such as formic acid, acetic acid, oxalic acid or tartaric acid; a hydrogen halide such as hydrofluoric acid, hydrochloric acid, hydrogen bromide or hydrogen iodide, or a salt thereof; or an oxo acid such as phosphoric acid or condensed phosphoric acid, or a salt thereof, may be mentioned.

The above complexing agent may be used as an acid form or a salt form such as an ammonium salt.

Among the above-described complexing agents, from the viewpoint of cleaning effect, chemical stability, etc., preferred is a nitrogen-containing carboxylic acid such as ethylenediaminetetraacetic acid (EDTA) or diethylenetriaminepentaacetic acid (DTPA); a nitrogen-containing phosphonic acid such as ethylenediaminetetrakis(methylenephosphonic acid) (EDTPO) or propylenediaminetetra(methylenephosphonic acid) (PDTMP); ethylenediamine di-o-hydroxyphenylacetic acid (EDDHA) or its derivative; N,N'-bis(2-hydroxybenzyl)ethylenediamine-N,N'-diacetic acid (HBED), or the like. Among them, in view of the cleaning effect, preferred is ethylenediamine di-o-hydroxyphenylacetic acid (EDDHA), ethylenediamine-N,N'-bis[(2-hydroxy-5-methylphenyl)acetic acid] (EDDHMA), diethylenetriaminepentaacetic acid (DTPA), ethylenediaminetetraacetic acid (EDTA) or propylenediaminetetra(methylenephosphonic acid) (PDTMP).

The above complexing agents may be used alone or in combination of two or more of them in an optional proportion.

The concentration of the complexing agent in the cleaning solution of the present invention may optionally be selected depending upon the type and the amount of contaminant metal impurities on the substrate for a semiconductor device to be cleaned, and the cleanness level required for the substrate surface. In order to obtain sufficient contamination removal and adhesion-preventing effects, generally it is usually at least 1 ppm, preferably at least 5 ppm, more preferably at least 10 ppm. However, when emphasis is put on reduction in possibility of the complexing agent being attached to and remaining on the substrate surface after the surface treatment and on economical efficiency, the concentration of the complexing agent is usually at most 10,000 ppm, preferably at most 1,000 ppm, more preferably at most 200 ppm.

Here, the complexing agent usually contains metal impurities such as Fe, Al and Zn at a level of from 1 to several thousand ppm in the form of a commercial agent, and the complexing agent used may be a metal contamination source in some cases. These metal impurities are present in the form of a stable complex formed with the complexing agent in the initial stages, but as the complexing agent decomposes during long-term use as the cleaning solution, the metal impurities are liberated from the complexing agent and adheres to the substrate surface to be cleaned. Accordingly, it is preferred to preliminarily purify the complexing agent to be used in the present invention before use, and it is preferred to reduce by the purification the contents of the metal impurities to usually at most 5 ppm, preferably at most 1 ppm, more preferably at most 0.1 ppm. The purification is preferably carried out, for example, by a method of dissolving the complexing agent in an acidic or alkaline solution, subjecting the solution to filtration to separate and remove insoluble impurities, followed by neutralization to precipitate crystals, and separating the crystals from the liquid.

Further, the cleaning solution of the present invention may contain another component in an optional proportion within a range not to impair its performance. Another component may, for example, be an anticorrosive such as a sulfur-containing organic compound (e.g. 2-mercaptothiazoline, 2-mercaptoimidazoline, 2-mercaptoethanol or thioglycerol), a nitrogen-containing organic compound (e.g. benzotriazole, 3-aminotriazole, $N(R^2)_3$ (wherein $R^2$ are $C_{1-4}$ alkyl groups and/or $C_{1-4}$ hydroxyalkyl groups which may be the same or different from one another), urea or thiourea), a water soluble polymer (e.g. polyethylene glycol or polyvinyl alcohol) or an alkyl alcohol type compound ($R^3OH$ (wherein $R^3$ is a $C_{1-4}$ alkyl group)), or an etching accelerator with which an effect of removing a polymer or the like strongly attached after dry etching can be expected, for example, an acid such as sulfuric acid, hydrochloric acid or methanesulfonic acid, a reducing agent such as hydrazine, a dissolved gas such as hydrogen, argon or nitrogen, hydrofluoric acid, ammonium fluoride or BHF (buffered hydrofluoric acid).

As another component to be contained in the cleaning solution of the present invention, an oxidizing agent such as hydrogen peroxide, ozone or oxygen may also be mentioned. In a case where the surface of a silicon (bare silicon) substrate with no oxide film is to be cleaned in a step of cleaning the substrate for a semiconductor device, surface roughening by etching on the substrate surface can be suppressed by incorporating an oxidizing agent. In a case where hydrogen peroxide or the like is incorporated in the cleaning solution of the present invention, the concentration of hydrogen peroxide in the cleaning solution is usually at least 0.01 wt %, preferably at least 0.1 wt %, and usually at most 5 wt %, preferably at most 1 wt %.

In some cases, a wiring for a semiconductor device or an element electrode for a device, made of a metal material which will react with hydrogen peroxide and be dissolved, is exposed to the surface of the substrate to be cleaned. Such a metal material may, for example, be a transition metal such as Cu or W or a transition metal compound. In such a case, the cleaning solution to be used for cleaning preferably contains substantially no hydrogen peroxide. The cleaning solution of the present invention has sufficient cleaning performance without adversely affecting such a metal material even when it contains substantially no hydrogen peroxide, as different from a conventional APM cleaning solution.

The cleaning solution of the present invention "contains substantially no hydrogen peroxide" means that there will be no adverse effect by hydrogen peroxide such as corrosion or degeneration over materials on a substrate to be cleaned, for example, a wiring material and an electrode material such as Cu or W and a low dielectric constant film. Namely, it means that these materials sufficiently function as a wiring, an electrode and the like when they are assembled into a semiconductor device. For that purpose, it is preferred that no hydrogen peroxide is contained in the cleaning solution of the present invention, and that even when contained, its content is suppressed to be as low as possible. The content is, for example, at most 10 ppm, preferably 1 ppm, more preferably at most 10 ppb.

Preparation of the cleaning solution of the present invention may be carried out in accordance with a known method. Any two or more components among the constituents (organic acid, organic alkaline component, surfactant and water, and as the case requires, another component such as complexing agent) for the cleaning solution of the present invention may be preliminarily blended and then the other components are mixed, or all the constituents may be mixed all at once.

The cleaning solution of the present invention is used for cleaning the surface of a substrate for a semiconductor device, of which metal contamination and particle contamination are problematic, such as a semiconductor, glass, a metal, a ceramic, a resin, a magnetic material or a superconductor. Particularly, it is suitably used for cleaning the surface of a substrate for a semiconductor device for which a highly clean substrate surface is required, in production of a substrate for a semiconductor device e.g. for a semiconductor device or a display device. On the surface of such a substrate, a wiring, an electrode or the like may be present. As a material of the wiring or the electrode, a semiconductor material such as Si, Ge or GaAs; an insulating material such as $SiO_2$, silicon nitride, glass, a low dielectric constant material, aluminum oxide, a transition metal oxide (e.g. titanium oxide, tantalum oxide, hafnium oxide or zirconium oxide), $(Ba, Sr)TiO_2$ (BST), polyimide or an organic thermosetting resin; a metal such as W, Cu or Al or an alloy thereof, a silicide or a nitride, may, for example, be mentioned. The low dielectric constant material generically represents a material having a relative dielectric constant of at most 3.5. The relative dielectric constant of $SiO_2$ is from 3.8 to 3.9.

Particularly, the cleaning solution of the present invention is suitably used for cleaning a substrate for a semiconductor device having a transition metal or a transition metal compound on its surface, since the cleaning solution will not corrode the metal surface, and the surfactant which tends to remain on the metal surface can be removed by rinsing in a short time, whereby the throughput can be improved. The transition metal may, for example, be W, Cu, Ti, Cr, Co, Zr, Hf, Mo, Ru, Au, Pt or Ag, and the transition metal compound may, for example, be a nitride, an oxide or a silicide of these transition metals. Among them, preferred is W and/or Cu.

The cleaning solution of the present invention can also be suitably used for cleaning a substrate for a semiconductor device having a low dielectric constant interlayer insulating film on its surface. The low dielectric constant material may be an organic polymer material such as polyimide, BCB (benzocyclobutene), Flare (Honeywell), SiLK (Dow Chemical) or an inorganic polymer material such as FSG (fluorinated silicate glass), or a SiOC type material such as BLACK DIAMOND (Applied Materials) or Aurora (ASM Japan K.K.). Particularly with respect to a highly hydrophobic low dielectric constant insulating film such as Flare, SiLK, BLACK DIAMOND or Aurora, by using the present cleaning solution, contamination on the substrate surface can be removed in a short time.

As a step of cleaning the substrate having Cu or a low dielectric constant insulating film on its surface, particularly, a cleaning step after CMP (chemical mechanical polishing) is applied to the Cu film or a cleaning step after holes are made in the interlayer insulating film on the wiring by dry etching may be mentioned, and the cleaning solution of the present invention having the above effects can be suitably used.

In the CMP step, the substrate is rubbed with a pad employing an abrasive and polished. The abrasive component may be abrasive grains, an oxidizing agent, a dispersant or another additive. The abrasive grains may, for example, be colloidal silica ($SiO_2$), fumed silica ($SiO_2$), alumina ($Al_2O_3$) or ceria ($CeO_2$). The oxidizing agent may, for example, be hydrogen peroxide, ammonium persulfate, iron nitrate or potassium iodate. The dispersant may, for example, be a surfactant, KOH, ammonia or amine. Another additive may, for example, be an organic acid (such as citric acid or quinaldic acid) or an anticorrosive. Particularly for CMP polishing of the Cu film, the Cu film is likely to be corroded and it is important to use an anticorrosive, and among anticorrosives, an azole type anticorrosive having a high anticorrosive effect is preferably used. An azole generically means a compound which is a 5-membered aromatic compound containing at least two hetero atoms, at least one of hetero atoms being a nitrogen atom. As one containing a hetero atom other than nitrogen, one containing oxygen or sulfur is well known. A heterocyclic ring containing nitrogen alone as the hetero atoms may be a diazole type, a triazole type or a tetrazole type. A heterocyclic ring containing nitrogen and oxygen may be an oxazole type, an isoxazole type or an oxadiazole type, and a heterocyclic ring containing nitrogen and sulfur may be a thiazole type, an isothiazole type or a thiadiazole type. Among them, a benzotriazole (BTA) type anticorrosive excellent in the anticorrosive effect is particularly preferably used. Further, the abrasives may be acidic, neutral or alkaline and have various pH depending upon their compositions, and they can be selected depending upon the purpose of use.

The cleaning solution of the present invention is excellent in that when applied to the surface after polished with an abrasive containing the above anticorrosive, contamination derived from the anticorrosive can be very effectively removed. Namely, if the abrasive contains the anticorrosive, the anticorrosive will suppress corrosion of the Cu film surface, but it will react with Cu ions eluted at the time of polishing and form a large amount of insoluble precipitates. The cleaning solution of the present invention is capable of effectively dissolving and removing such insoluble precipitates. Further, the surfactant which tends to be remain on the metal surface can be removed by rinsing in a short time, whereby the throughput can be improved. The cleaning solution can be suitably used particularly for cleaning of a substrate for a semiconductor device having both Cu film and low dielectric constant insulating film on its surface, after CMP treatment is applied to the surface with an abrasive containing an azole type anticorrosive.

The cleaning method of the present invention is carried out by a method of directly contacting the cleaning solution of the present invention with the substrate. The method of contacting the cleaning solution with the substrate may, for example, be a dipping method wherein a cleaning tank is filled with the cleaning solution and the substrate is dipped therein, a spinning method of rotating the substrate at a high speed while the cleaning solution is supplied on the substrate from a nozzle, or a spraying method of spraying the cleaning solution on the substrate for cleaning. An apparatus for carrying out such cleaning may, for example, be a batch system cleaning apparatus of cleaning a plurality of substrates accommodated in a cassette all at once or a sheet-fed system cleaning apparatus for cleaning one substrate fixed in a holder.

The cleaning solution of the present invention is applicable to any of the above methods, but is preferably used for spinning type or spraying type cleaning, since contamination can be removed more effectively in a short time. It is preferably applied to a sheet-fed system cleaning apparatus for which shortening of the cleaning time and reduction in the amount of the cleaning solution are desired, whereby these objects will be accomplished.

Further, the cleaning method of the present invention is preferably combined with cleaning by means of physical force, particularly scrubbing cleaning employing a cleaning brush or Megasonic cleaning at a frequency of at least 0.5 MHz, whereby removability of particle contamination will further improve, thus leading to shortening of the cleaning time. Particularly in cleaning after CMP, it is preferred to carry out scrubbing cleaning employing a resin brush. The material of the resin brush may optionally be selected, and it is preferred to employ, for example, PVA (polyvinyl alcohol).

Further, before and/or after the cleaning of the present invention, cleaning with electrolytic ionized water obtained by electrolysis of water or hydrogen water having hydrogen gas dissolved in water may be carried out.

The cleaning solution is used usually at room temperature, but may be heated at from about 40 to about 70° C. within a range of not impairing the quality.

EXAMPLES

Now, the present invention will be described in further detail with reference to Examples and Comparative Examples. However, the present invention is by no means restricted to the following Examples within a range not to exceed the scope of the present invention.

In Tables 1 to 6, the concentration of metal impurities represents the concentration of Na, Mg, Al, K, Ca, Cu, Pb and Zn contained in the cleaning agent. Further, the following abbreviations have the respective following meanings. Further, the unit of metal removability in Table 5 is concentration×$10^{10}$ atoms/cm$^2$.

TMAH: Tetramethylammonium hydroxide
N(Et)3: Triethylamine
Choline: Trimethyl(hydroxyethyl)ammonium hydroxide
DBS: Dodecylbenzenesulfonic acid
DPDSA: Dodecyldiphenyl ether disulfonic acid ammonium salt
MMTA: Ammonium N-myristoylmethyltaurine
MSA: Methanesulfonic acid
IPA: Isopropyl alcohol Examples 1 to 12 and Comparative Examples 1 to 6

(Evaluation of Cleaning Properties Against Particle Contamination by Scrubbing Cleaning)

A 8 inch silicon substrate provided with a Cu film was polished with a slurry (acidic, containing SiO$_2$ particles) for CMP containing a benzotriazole type anticorrosive for one minute and then polished with water for 17 seconds. The substrate after the CMP polishing was subjected to brush scrubbing cleaning employing a PVA brush by means of a multispinner ("KSSP-201" manufactured by KAIJO Corporation) using a cleaning solution having a formulation as identified in Table 1 to remove particles. Cleaning by the cleaning solution was carried out at room temperature for 30 seconds, and then the substrate was rinsed with ultrapure water for 10 seconds or 30 seconds, followed by spin drying to obtain a cleaned substrate.

Then, the number of particles (particle sizes of at least 0.35 μm) attached on the substrate surface was measured by a laser surface inspection device ("LS-6600" manufactured by Hitachi Electronics Engineering Co., Ltd.), and the results are shown in Table 1.

It is understood from Table 1 that by use of the cleaning solution for a substrate for a semiconductor device of the present invention, particle contamination on the Cu film after polished with a slurry (acidic, containing SiO$_2$ particles) for CMP containing a benzotriazole type anticorrosive can be prevented, the substrate can be highly cleaned, and the rinsing time can be shortened to a very short time of 10 seconds.

It was confirmed that rinsability improved and the same effect could be obtained even when acetic acid or oxalic acid was used as the organic acid as component (a).

Examples 13 and 14

(Evaluation of Cleaning Properties Against Particle Contamination by Scrubbing Cleaning)

A 8 inch silicon substrate provided with a Cu film was polished with a slurry (alkaline, containing SiO$_2$ particles) for CMP containing an anticorrosive for one minute and then polished with water for 17 seconds. The substrate after the CMP polishing was subjected to brush scrubbing cleaning employing a PVA brush by means of a multispinner ("KSSP-201" manufactured by KAIJO Corporation) using a cleaning solution having a formulation as identified in Table 2 to remove particles. Cleaning by the cleaning solution was carried out at room temperature for 30 seconds, and then the substrate was rinsed with ultrapure water for 30 seconds, followed by spin drying to obtain a cleaned substrate.

Then, the number of particles (particle sizes of at least 0.35 μm) attached on the substrate surface was measured by a laser surface inspection device ("LS-6600" manufactured by Hitachi Electronics Engineering Co., Ltd.), and the results are shown in Table 2.

It is understood from Table 2 that the number of particles remaining on the Cu film is very small, and that by use of the cleaning solution for a substrate for a semiconductor device of the present invention, particle contamination of the Cu film after polished with a slurry (alkaline, containing SiO$_2$ particles) for CMP containing an anticorrosive can be prevented and the substrate can be highly cleaned.

Examples 15 to 16

(Evaluation for Cleaning Properties Against Particle Contamination by Scrubbing Cleaning)

A 8 inch silicon substrate provided with a Cu film was polished with a slurry (acidic, containing SiO$_2$ particles) for CMP containing a benzotriazole type anticorrosive for one minute, and polishing was completed without polishing with water, and the substrate was taken out. In a state where Cu contamination remained on a polishing pad, a 8 inch silicon substrate provided with a Low-k film (BLACK DIAMOND film) was polished with a slurry (acidic, SiO$_2$ particles) for CMP containing a benzotriazole type anticorrosive for one minute and then polished with water for 17 seconds. The substrate provided with a Low-k film (BLACK DIAMOND film) after the CMP polishing was subjected to brush scrubbing cleaning employing a PVA brush by means of a multispinner ("KSSP-201" manufactured by KAIJO Corporation) employing a cleaning solution having a formulation as identified in Table 3 to remove particles. The cleaning by the cleaning solution was carried out at room temperature for 30 seconds, and then the substrate was rinsed with ultrapure water for 30 seconds or 60 seconds, followed by spin drying to obtain a cleaned substrate.

Then, the number of particles (particle sizes of at least 0.2 μm) attached to the substrate surface was measured by a laser surface inspection device ("LS-6600" manufactured by Hitachi Electronics Engineering Co., Ltd.), and the results are shown in Table 3.

It is understood from Table 3 that by use of the cleaning solution for a substrate for a semiconductor device of the present invention, even with respect to a substrate provided with a Low-k film which is usually hardly cleaned, particle contamination after polishing with a slurry (acidic, containing $SiO_2$ particles) for CMP containing a benzotriazole type anticorrosive can be prevented and the substrate can be highly cleaned.

Example 17 to 18

(Evaluation for Cleaning Properties Against Particle Contamination by Scrubbing Cleaning)

A 8 inch silicon substrate provided with a Cu film was polished with a slurry (alkaline, containing $SiO_2$ particles) for CMP containing an anticorrosive for one minute, and polishing was completed without polishing with water, and the substrate was taken out. In a state where Cu contamination remained on a polishing pad, a 8 inch silicon substrate provided with a Low-k film (BLACK DIAMOND film) was polished with a slurry (alkaline, $SiO_2$ particles) for CMP containing an anticorrosive for one minute and then polished with water for 17 seconds. The substrate provided with a Low-k film (BLACK DIAMOND film) after the CMP polishing was subjected to brush scrubbing cleaning employing a PVA brush by means of a multispinner ("KSSP-201" manufactured by KAIJO Corporation) employing a cleaning solution having a formulation as identified in Table 4 to remove particles. The cleaning by the cleaning solution was carried out at room temperature for 30 seconds, and then the substrate was rinsed with ultrapure water for 30 seconds, followed by spin drying to obtain a cleaned substrate.

Then, the number of particles (particle sizes of at least 0.2 μm) attached to the substrate surface was measured by a laser surface inspection device ("LS-6600" manufactured by Hitachi Electronics Engineering Co., Ltd.), and the results are shown in Table 4.

It is understood from Table 4 that by use of the cleaning solution for a substrate for a semiconductor device of the present invention, even with respect to a substrate provided with a Low-k film which is usually hardly cleaned, particle contamination after polishing with a slurry (alkaline, containing $SiO_2$ particles) for CMP containing an anticorrosive can be prevented and the substrate can be highly cleaned.

It is understood from Tables 1 to 4 that by use of the cleaning solution for a substrate for a semiconductor device of the present invention, particle contamination can be prevented, and the substrate can be highly cleaned, with respect to both the Cu film and the Low-k film, after polishing with either the slurry (acidic, containing $SiO_2$ particles) for CMP containing a benzotriazole type anticorrosive or the slurry (alkaline, containing $SiO_2$ particles) for CMP containing an anticorrosive. Further, it is understood that by the cleaning solution for a substrate for a semiconductor device of the present invention, the rinsing time can be shortened as compared with conventional one.

Example 19

(Evaluation for Cleaning Properties Against Particle Contamination by Scrubbing Cleaning)

A 8 inch silicon substrate provided with a Cu film was polished with a slurry (acidic, containing $SiO_2$ particles) for CMP containing a benzotriazole type anticorrosive for one minute, and polishing was completed without polishing with water, and the substrate was taken out. In a state where Cu contamination remained on a polishing pad, a 8 inch silicon substrate provided with a TEOS (tetraethoxysilane) film was polished with a slurry (acidic, $SiO_2$ particles) for CMP containing a benzotriazole type anticorrosive for one minute and then polished with water for 17 seconds. The substrate provided with a TEOS film after the polishing was subjected to brush scrubbing cleaning employing a PVA brush by means of a multispinner ("KSSP-201" manufactured by KAIJO Corporation) employing a cleaning solution as identified in Table 5 to remove. The cleaning by the cleaning solution was carried out at room temperature for 30 seconds, and then the substrate was rinsed with ultrapure water for 60 seconds, followed by spin drying to obtain a cleaned substrate.

The remaining contaminant metals (Fe and Cu) on the substrate were analyzed by the following method, and the results are shown in Table 5.

(Method of Analyzing Remaining Contaminant Metals)

Metals on the substrate surface were recovered by treating the substrate with an aqueous solution containing 0.1 wt % of hydrofluoric acid and 1 wt % of hydrogen peroxide, and the amount of the metals was measured by means of an inductively coupled plasma mass spectrometer (ICP-MS) and calculated as the metal concentration ($\times 10^{10}$ atoms/cm$^2$) on the substrate surface.

It is understood from Table 5 that by use of the cleaning solution for a substrate for a semiconductor device of the present invention, metal contamination can be prevented and the substrate can be highly cleaned.

Example 20 and Comparative Example 7

(Evaluation of Cu Film Etching Rate)

A piece (1.5 cm×2 cm) of a 8 inch silicon substrate provided with a Cu film was immersed in a cleaning solution as identified in Table 6 for 3 hours. The Cu concentration (ppb) of the cleaning solution after immersion was measured by means of an inductively coupled plasma mass spectrometer (ICP-MS) to calculate the Cu etching rate (nm/min) of the cleaning solution from the following formula.

$$\text{Cu etching rate(nm/min)} = C \times L/G/S/100/H$$

C: Cu concentration (ppb) of cleaning solution
L: Amount (cm$^3$) of cleaning solution
G: Density (8.95 g/cm$^3$) of Cu
S: Area (cm$^2$) of the Cu substrate piece
H: Immersion time (180 min)

It is understood from Table 6 that the cleaning solution for a substrate for a semiconductor device of the present invention has a very low Cu etching rate, and is capable of highly cleaning the substrate while corrosion of a metal wiring on the substrate is prevented.

From the above results, it is evident that the cleaning solution of the present invention is excellent in removability of fine particles (particles) after polishing by a slurry for CMP containing an anticorrosive, and is also excellent in cleaning properties in rinsing in a short time. Further, it is evident that the cleaning solution has similarly excellent cleaning effects in view of removability of metal contamination and prevention of corrosion of a metal wiring.

The entire disclosure of Japanese Patent Application No. 2004-032222 filed on Feb. 9, 2004 including specification, claims and summary is incorporated herein by reference in its entirety.

TABLE 1

| | Component (a) organic acid | Content wt % | Component (b) alkaline component | Content wt % | Component (c) surfactant | Content wt % | Component (d) water |
|---|---|---|---|---|---|---|---|
| Ex. 1 | Citric acid | 0.5 | TMAH | 0.33 | DBS | 0.007 | Ultrapure water |
| Ex. 2 | Citric acid | 0.5 | TMAH | 0.37 | DBS | 0.017 | Ultrapure water |
| Ex. 3 | Citric acid | 0.5 | TMAH | 0.29 | DBS | 0.017 | Ultrapure water |
| Ex. 4 | Citric acid | 0.5 | TMAH | 0.29 | DBS | 0.017 | Ultrapure water |
| Ex. 5 | Citric acid | 0.5 | TMAH | 0.20 | DBS | 0.017 | Ultrapure water |
| Ex. 6 | Citric acid | 0.5 | TMAH | 0.13 | DBS | 0.017 | Ultrapure water |
| Ex. 7 | Citric acid | 0.5 | TMAH | 0.10 | DBS | 0.017 | Ultrapure water |
| Ex. 8 | Citric acid | 0.5 | N(Et)3 | 0.20 | DBS | 0.017 | Ultrapure water |
| Ex. 9 | Citric acid | 0.5 | Choline | 0.27 | DBS | 0.017 | Ultrapure water |
| Ex. 10 | Citric acid | 0.5 | TMAH | 0.29 | DPDSA | 0.017 | Ultrapure water |
| Ex. 11 | Citric acid | 0.5 | TMAH | 0.20 | DPDSA | 0.017 | Ultrapure water |
| Ex. 12 | Citric acid | 0.5 | TMAH | 0.20 | MMT | 0.017 | Ultrapure water |
| Comp. Ex. 1 | Citric acid | 0.5 | NH3 | 0.20 | DBS | 0.017 | Ultrapure water |
| Comp. Ex. 2 | Citric acid | 0.5 | — | — | DBS | 0.017 | Ultrapure water |
| Comp. Ex. 3 | Citric acid | 0.5 | — | — | DBS | 0.017 | Ultrapure water |
| Comp. Ex. 4 | Citric acid | 0.5 | TMAH | 1.00 | DBS | 0.017 | Ultrapure water |
| Comp. Ex. 5 | Citric acid | 0.5 | — | — | DBS | 0.017 | Ultrapure water |
| Comp. Ex. 6 | Citric acid | 0.5 | — | — | DBS | 0.017 | Ultrapure water |

| | Another component | Content wt % | Concentration of metal impurities *1 | pH | Component (a)/ component (b) | Component (c)/ component (b) | Cleaning time (sec) | Rinsing time (sec) | Number of remaining particles (>0.35 μm) |
|---|---|---|---|---|---|---|---|---|---|
| Ex. 1 | — | — | <1 ppb | 4.3 | 1.5 | 0.02 | 30 | 10 | 72 |
| Ex. 2 | — | — | <1 ppb | 4.5 | 1.4 | 0.05 | 30 | 10 | 55 |
| Ex. 3 | — | — | <1 ppb | 4.0 | 1.7 | 0.06 | 30 | 30 | 15 |
| Ex. 4 | — | — | <1 ppb | 4.0 | 1.7 | 0.06 | 30 | 10 | 23 |
| Ex. 5 | — | — | <1 ppb | 3.3 | 2.5 | 0.08 | 30 | 10 | 13 |
| Ex. 6 | — | — | <1 ppb | 2.9 | 3.8 | 0.13 | 30 | 10 | 50 |
| Ex. 7 | — | — | <1 ppb | 2.7 | 5.0 | 0.17 | 30 | 10 | 159 |
| Ex. 8 | — | — | <1 ppb | 3.1 | 2.5 | 0.08 | 30 | 10 | 56 |
| Ex. 9 | — | — | <1 ppb | 3.4 | 1.9 | 0.06 | 30 | 10 | 21 |
| Ex. 10 | — | — | <1 ppb | 3.3 | 1.7 | 0.06 | 30 | 10 | 4 |
| Ex. 11 | — | — | <1 ppb | 4.1 | 2.5 | 0.08 | 30 | 10 | 13 |
| Ex. 12 | — | — | <1 ppb | 3.3 | 2.5 | 0.08 | 30 | 10 | 6 |
| Comp. Ex. 1 | — | — | <1 ppb | 9.8 | 2.5 | 0.08 | 30 | 10 | 235 |
| Comp. Ex. 2 | — | — | <1 ppb | 2.1 | — | — | 30 | 30 | 33 |
| Comp. Ex. 3 | — | — | <1 ppb | 2.1 | — | — | 30 | 10 | 231 |
| Comp. Ex. 4 | — | — | <1 ppb | 12.8 | 0.5 | 0.02 | 30 | 10 | 445 |
| Comp. Ex. 5 | MSA | 0.20 | <1 ppb | 1.6 | — | — | 30 | 10 | 212 |
| Comp. Ex. 6 | IPA | 0.20 | <1 ppb | 2.2 | — | — | 30 | 10 | 533 |

*1 Concentration of metal impurities represents the concentration of Na, Mg, Al, K, Ca, Fe, Cu, Pb and Zn contained in the cleaning solution

TABLE 2

| | Component (a) organic acid | Content wt % | Component (b) alkaline component | Content wt % | Component (c) surfactant | Content wt % | Component (d) water |
|---|---|---|---|---|---|---|---|
| Ex. 13 | Citric acid | 0.25 | TMAH | 0.10 | DBS | 0.008 | Ultrapure water |
| Ex. 14 | Citric acid | 0.25 | TMAH | 0.14 | DPDSA | 0.008 | Ultrapure water |

TABLE 2-continued

| | Concentration of metal impurities *1 | pH | Component (a)/ component (b) | Component (c)/ component (b) | Cleaning time (sec) | Rinsing time (sec) | Number of remaining particles (>0.35 μm) |
|---|---|---|---|---|---|---|---|
| Ex. 13 | <1 ppb | 3.3 | 2.5 | 0.08 | 30 | 30 | 22 |
| Ex. 14 | <1 ppb | 4.0 | 1.8 | 0.06 | 30 | 30 | 11 |

*1 Concentration of metal impurities represents the concentration of Na, Mg, Al, K, Ca, Fe, Cu, Pb and Zn contained in the cleaning solution

TABLE 3

| | Component (a) organic acid | Content wt % | Component (b) alkaline component | Content wt % | Component (c) surfactant | Content wt % | Component (d) water |
|---|---|---|---|---|---|---|---|
| Ex. 15 | Citric acid | 0.5 | TMAH | 0.29 | DBS | 0.017 | Ultrapure water |
| Ex. 16 | Citric acid | 0.5 | TMAH | 0.29 | DBS | 0.017 | Ultrapure water |

| | Concentration of metal impurities *1 | pH | Component (a)/ component (b) | Component (c)/ component (b) | Cleaning time (sec) | Rinsing time (sec) | Number of remaining particles (>0.2 μm) |
|---|---|---|---|---|---|---|---|
| Ex. 15 | <1 ppb | 4.0 | 1.7 | 0.06 | 30 | 30 | 77 |
| Ex. 16 | <1 ppb | 4.0 | 1.7 | 0.06 | 30 | 60 | 80 |

*1 Concentration of metal impurities represents the concentration of Na, Mg, Al, K, Ca, Fe, Cu, Pb and Zn contained in the cleaning solution

TABLE 4

| | Component (a) organic acid | Content wt % | Component (b) alkaline component | Content wt % | Component (c) surfactant | Content wt % | Component (d) water |
|---|---|---|---|---|---|---|---|
| Ex. 17 | Citric acid | 0.25 | TMAH | 0.10 | DBS | 0.008 | Ultrapure water |
| Ex. 18 | Citric acid | 0.25 | TMAH | 0.14 | DPDSA | 0.008 | Ultrapure water |

| | Concentration of metal impurities *1 | pH | Component (a)/ component (b) | Component (c)/ component (b) | Cleaning time (sec) | Rinsing time (sec) | Number of remaining particles (>0.2 μm) |
|---|---|---|---|---|---|---|---|
| Ex. 17 | <1 ppb | 3.3 | 2.5 | 0.08 | 30 | 30 | 166 |
| Ex. 18 | <1 ppb | 4.0 | 1.8 | 0.06 | 30 | 30 | 173 |

*1 Concentration of metal impurities represents the concentration of Na, Mg, Al, K, Ca, Fe, Cu, Pb and Zn contained in the cleaning solution

TABLE 5

| | Component (a) organic acid | Content wt % | Component (b) alkaline component | Content wt % | Component (c) surfactant | Content wt % | Component (d) water |
|---|---|---|---|---|---|---|---|
| Ex. 19 | Citric acid | 0.5 | TMAH | 0.29 | DBS | 0.017 | Ultrapure water |

| | Concentration of metal impurities *1 | pH | Component (a)/ component (b) | Component (c)/ component (b) | Cleaning time (sec) | Rinsing time (sec) | Metal removability *2 Fe | Cu |
|---|---|---|---|---|---|---|---|---|
| Ex. 19 | <1 ppb | 4.0 | 1.7 | 0.06 | 30 | 60 | 2 | 2 |

*1 Concentration of metal impurities represents the concentration of Na, Mg, Al, K, Ca, Fe, Cu, Pb and Zn contained in the cleaning solution
*2 Unit: Concentration ×$10^{10}$ atoms/cm$^2$

TABLE 6

| | Component (a) organic acid | Content wt % | Component (b) alkaline component | Content wt % | Component (c) surfactant | Content wt % | Component (d) water |
|---|---|---|---|---|---|---|---|
| Ex. 20 | Citric acid | 0.25 | TMAH | 0.10 | DBS | 0.008 | Ultrapure water |
| Comp. Ex. 7 | Citric acid | 0.25 | — | — | DBS | 0.008 | Ultrapure water |

| | Concentration of metal impurities *1 | pH | Component (a)/ component (b) | Component (c)/ component (b) | Immersion time (hr) | Etching rate (nm/min) |
|---|---|---|---|---|---|---|
| Ex. 20 | <1 ppb | 4.0 | 2.5 | 0.08 | 3 | 0.05 |
| Com. Ex. 7 | <1 ppb | 2.1 | — | — | 3 | 0.17 |

*1 Concentration of metal impurities represents the concentration of Na, Mg, Al, K, Ca, Fe, Cu, Pb and Zn contained in the cleaning solution

What is claimed is:

1. A cleaning solution for a substrate for a semiconductor device, which comprises the following components (a), (b), (c) and (d), wherein the weight ratio of the component (a) to the component (b) (component (a)/component (b)) is at least 0.8 and at most 5, and said solution has a pH of at least 1.5 and less than 6.5:
   component (a): an organic acid;
   component (b): an organic alkaline component represented by the following formula (I), $(R^1)_4N^+OH^-$         (I), wherein $R^1$ is a hydrogen atom or an alkyl group which may be substituted by a hydroxyl group, an alkoxy group or halogen, and four $R^1$ may all be the same or different from one another, provided that a case where all are simultaneously hydrogen atoms, is excluded;
   component (c): at least one anionic surfactant selected from the group consisting of an alkylsulfonic acid or a salt thereof, an alkylbenzenesulfonic acid or a salt thereof, an alkyldiphenyl ether disulfonic acid or a salt thereof, an alkylmethyltaurate or a salt thereof, an alkyl sulfate or a salt thereof, an alkyl ether sulfate or a salt thereof, and a sulfosuccinic acid diester or a salt thereof; and
   component (d): water.

2. The cleaning solution for a substrate for a semiconductor device according to claim 1, wherein the substrate for a semiconductor device has a metal wiring on its surface.

3. The cleaning solution for a substrate for a semiconductor device according to claim 1, wherein the substrate for a semiconductor device has a low dielectric constant insulating film on its surface.

4. The cleaning solution for a substrate for a semiconductor device according to claim 1, wherein the component (a) is a $C_{1-10}$ organic compound having at least one carboxyl group.

5. The cleaning solution for a substrate for a semiconductor device according to claim 4, wherein the component (a) is at least one organic acid selected from the group consisting of acetic acid, propionic acid, oxalic acid, succinic acid, malonic acid, citric acid, tartaric acid and malic acid.

6. The cleaning solution for a substrate for a semiconductor device according to claim 1, wherein the component (b) is a quaternary ammonium hydroxide having a C1-4 alkyl group and/or a C1-4 hydroxyalkyl group.

7. The cleaning solution for a substrate for a semiconductor device according to claim 1, wherein the content of the component (a) is from 0.05 to 10 wt%.

8. The cleaning solution for a substrate for a semiconductor device according to claim 1, wherein the content of the component (b) is from 0.01 to 10 wt%.

9. The cleaning solution for a substrate for a semiconductor device according to claim 1, wherein the content of the component (c) is from 0.0003 to 0.1 wt%.

10. The cleaning solution for a substrate for a semiconductor device according to claim 1, wherein the weight ratio of the component (c) to the compound (b) component (c)/component (b)) is at least 0.01 and at most 0.2.

11. A method for cleaning a substrate for a semiconductor device, which comprises cleaning a substrate for a semiconductor device by means of a solution which comprises the following components (a), (b), (c) and (d), wherein the weight ratio of the component (a) to the component (b) (component (a)/component (b)) is at least 0.8 and at most 5, and said solution has a pH of at least 1.5 and less than 6.5:
    component (a): an organic acid;
    component (b): an organic alkaline component represented by the following formula (I), $(R^1)_4N^+OH^-$         (I), wherein $R^1$ is a hydrogen atom or an alkyl group which may be substituted by a hydroxyl group, an alkoxy group or halogen, and four $R^1$ may all be the same or different from one another, provided that a case where all are simultaneously hydrogen atoms, is excluded;
    component (c): at least one anionic surfactant selected from the group consisting of an alkylsulfonic acid or a salt thereof, an alkylbenzenesulfonic acid or a salt thereof, an alkyldiphenyl ether disulfonic acid or a salt thereof, an alkylmethyltaurate or a salt thereof, an alkyl sulfate or a salt thereof, an alkyl ether sulfate or a salt thereof, and a sulfosuccinic acid diester or a salt thereof; and
    component (d): water.

12. The method for cleaning a substrate for a semiconductor device according to claim 11, wherein the substrate for a semiconductor device has a Cu film and a low dielectric constant insulating film on the substrate surface, and the substrate is cleaned after CMP treatment.

13. The method for cleaning a substrate for a semiconductor device according to claim 12, wherein the CMP treatment is carried out by an abrasive containing an azole type anticorrosive.

* * * * *